US010852197B2

(12) United States Patent
Geetla (10) Patent No.: US 10,852,197 B2
(45) Date of Patent: Dec. 1, 2020

(54) TEMPERATURE SENSOR IN AN INTEGRATED CIRCUIT HAVING OFFSET CANCELLATION

(71) Applicant: NXP USA, INC., Austin, TX (US)

(72) Inventor: Ravichandar Reddy Geetla, Austin, TX (US)

(73) Assignee: NXP USA, Inc., Austin, TX (US)

( * ) Notice: Subject to any disclaimer, the term of this patent is extended or adjusted under 35 U.S.C. 154(b) by 346 days.

(21) Appl. No.: 15/948,394

(22) Filed: Apr. 9, 2018

(65) Prior Publication Data
US 2019/0310141 A1 Oct. 10, 2019

(51) Int. Cl.
| | |
|---|---|
| G01K 7/01 | (2006.01) |
| H03K 4/48 | (2006.01) |
| H03K 5/08 | (2006.01) |
| H03K 5/26 | (2006.01) |
| H03K 21/38 | (2006.01) |
| H03M 1/06 | (2006.01) |
| G01K 15/00 | (2006.01) |
| H03M 1/56 | (2006.01) |

(52) U.S. Cl.
CPC ............ *G01K 7/01* (2013.01); *G01K 15/005* (2013.01); *H03K 4/48* (2013.01); *H03K 5/084* (2013.01); *H03K 5/26* (2013.01); *H03K 21/38* (2013.01); *H03M 1/0607* (2013.01); *H03M 1/56* (2013.01); *G01K 2219/00* (2013.01)

(58) Field of Classification Search
CPC .......... G01K 15/005; G01K 7/01; G01K 7/24; G01K 7/25; G01K 2219/00; H02M 3/156; H02M 3/157; H02M 7/2176
See application file for complete search history.

(56) References Cited

U.S. PATENT DOCUMENTS

| | | | |
|---|---|---|---|
| 3,477,292 A | 11/1969 | Thornton | |
| 3,710,374 A | 1/1973 | Kelly et al. | |
| 4,030,363 A * | 6/1977 | Halleck | G01K 1/028 374/170 |
| 4,165,642 A * | 8/1979 | Lipp | G01K 1/028 257/E27.031 |

(Continued)

OTHER PUBLICATIONS

U.S. Appl. No. 15/471,021; Geetla, at al.; Title: "Temperature Sensor in an Integrated Circuit and Method of Calibrating the Temperature Sensor;"; filed Mar. 28, 2017.

*Primary Examiner* — Gail Kaplan Verbitsky (57) ABSTRACT

Performing a temperature measurement operation includes a first phase and a second phase. The first phase includes providing a voltage indicative of a measured temperature to a first input of a comparator, providing a ramp signal to a second input of the comparator, and generating at an output of the comparator, pulses based on a comparison of the first input to the second input of the comparator. The second phase includes providing the voltage indicative of a measured temperature to the second input of the comparator, providing the ramp signal to the first input of the comparator, and generating at an output of the comparator, pulses based on a comparison of the first input to the second input of the comparator. Performing the temperature measurement operation also includes utilizing the pulses generated during the first and second phases to provide a digital indication of the measured temperature.

10 Claims, 6 Drawing Sheets

(56) References Cited

U.S. PATENT DOCUMENTS

| | | | | |
|---|---|---|---|---|
| 4,875,783 A * | 10/1989 | Swanson | G01K 7/01 | 374/170 |
| 5,056,048 A * | 10/1991 | Seperant | G01K 1/028 | 374/170 |
| 6,412,977 B1 * | 7/2002 | Black | G01K 1/024 | 323/315 |
| 6,847,319 B1 * | 1/2005 | Stockstad | G01K 7/01 | 341/119 |
| 7,726,877 B1 | 6/2010 | Avitan | | |
| 7,924,207 B2 | 4/2011 | Snoeij et al. | | |
| 8,044,732 B2 * | 10/2011 | Kossel | H03B 5/1256 | 331/117 FE |
| 8,197,133 B2 | 6/2012 | Schultz et al. | | |
| 8,330,537 B1 * | 12/2012 | Ghorpade | H03F 3/38 | 330/9 |
| 9,019,727 B2 * | 4/2015 | Chen | H02M 3/156 | 363/21.12 |
| 9,354,124 B2 * | 5/2016 | Horng | G01R 19/0084 | |
| 9,389,126 B2 | 7/2016 | Kim et al. | | |
| 9,791,488 B2 * | 10/2017 | Tai | G01R 27/2605 | |
| 10,656,032 B2 * | 5/2020 | Geetla | G01K 15/005 | |
| 10,732,210 B2 * | 8/2020 | Tai | G01K 7/01 | |
| 2006/0001750 A1 | 1/2006 | Mizuguchi et al. | | |
| 2009/0046761 A1 * | 2/2009 | Pan | G01K 7/16 | 374/178 |
| 2012/0262008 A1 * | 10/2012 | Becker | G01R 31/2844 | 307/113 |
| 2013/0214869 A1 * | 8/2013 | Matsuzaki | H03L 1/04 | 331/70 |
| 2015/0355037 A1 * | 12/2015 | Cottin | G01K 15/005 | 374/1 |
| 2016/0118992 A1 | 4/2016 | Milkov | | |
| 2016/0177907 A1 * | 6/2016 | Betscher | F02N 11/087 | 307/10.6 |
| 2018/0063457 A1 | 3/2018 | Shimamura et al. | | |
| 2020/0103292 A1 * | 4/2020 | Gailhard | G01K 15/005 | |

* cited by examiner

TEMPERATURE SENSOR IN AN INTEGRATED CIRCUIT HAVING OFFSET CANCELLATION

BACKGROUND

Field

This disclosure relates generally to temperature sensors, and more specifically, to a temperature sensor within an integrated circuit having offset cancellation.

Related Art

Within integrated circuits, localized high temperature areas can be created due to, for example, high switching events. These localized high temperature areas can be referred to as hot spots and can cause significant reliability and robustness issues with the integrated circuit. Therefore, a need exists for accurate temperature sensing.

One temperature sensing circuitry available today uses a base-emitter voltage of a bipolar device and a single slope ramp based time-to-digital converter to provide precise temperature sensing. However, this single slope ramp method requires a very fast clock that is not available on every integrated circuit for the temperature sensing circuit. Furthermore, an offset in any voltage buffers and comparators used in temperature sensing circuits can cause significant error in the final output of the temperature sensor.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A temperature sensing circuit senses a temperature dependent voltage and provides a digital value indicative of the sensed temperature. In one embodiment, the temperature sensing circuit uses comparisons with twin $1^{st}$-order temperature independent single slope ramp voltage references and counter circuitry for a time-to-digital conversion (TDC). The temperature sensing circuit uses buffers and comparators to obtain a temperature measurement. However, buffers and comparators introduce offset errors, which may be cumulative over a temperature measurement, which can introduce significant error in the final temperature measurement. Therefore, the temperature sensing circuit includes switch circuits coupled to the buffer and comparators which allows the inputs and outputs of these buffers and comparators to be swapped during a measurement operation. In this manner, some portion (e.g. half) of the measurement operation is performed with positive offsets and the remaining portion (e.g. other half) of the measurement operation is performed with negative offsets, thus resulting in a measurement operation having offset cancellation.

A temperature dependent voltage is provided as Vtemp to the temperature sensing circuit. In one embodiment, this temperature dependent voltage is provided by the base-emitter voltage (Vbe) of a diode-connected bipolar device. The voltage Vbe varies linearly with temperature. In alternate embodiments, Vtemp can be provided by other temperature dependent devices or circuits.

Figure 1:
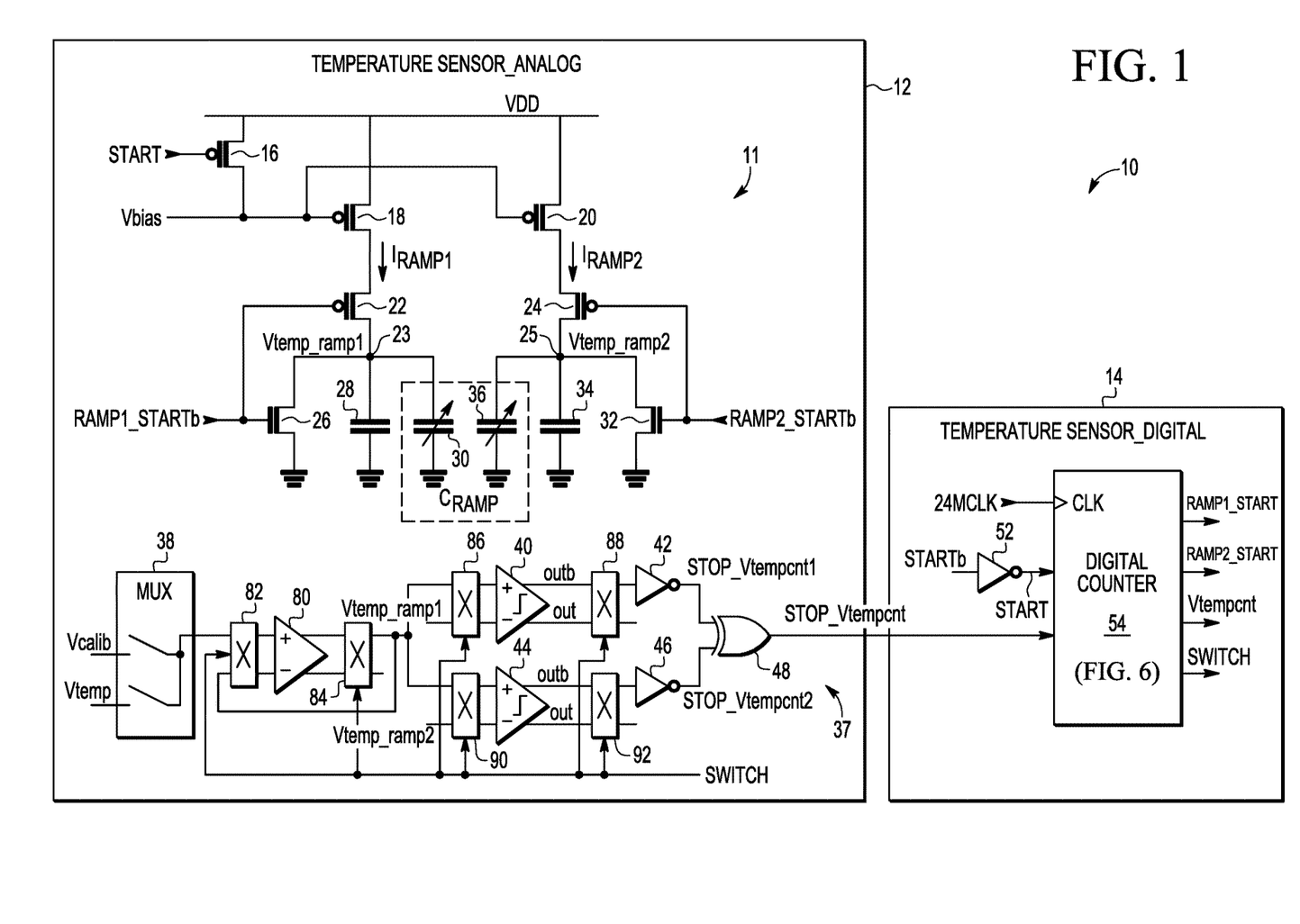
FIG. 1 illustrates, in partial schematic and partial block diagram form, a temperature sensor having switch circuits in accordance with one embodiment of the present invention.

FIG. 1 illustrates, in partial block diagram form and partial schematic form, a temperature sensing circuit 10 (also referred to as a temperature sensor). Temperature sensing circuit includes an analog portion 12 and a digital portion 14. Analog portion 12 includes ramp generation circuitry 11 and comparison circuitry 37 (which may also be referred to as pulse generating circuitry or pulse generation circuitry). Digital portion 14 includes digital counter 54 (which may also be referred to as counter circuitry).

Ramp generation circuitry 11 includes p-type transistors 16, 18, 20, 22, and 24, n-type transistors 26 and 32, capacitors 28 and 34 (which may be any type of capacitive element), and programmable capacitors 30 and 36 (also referred to as tunable capacitors). Transistor 16 has a first current electrode coupled to a first supply voltage (e.g. VDD), a control electrode (i.e. a gate electrode) coupled to receive a START signal. Transistor 18 has a first current electrode coupled to the first supply voltage and a control electrode (i.e. control gate) coupled to receive a bias voltage, Vbias. Transistor 22 has a first current electrode coupled to a second current electrode of transistor 18, a control electrode coupled to receive a RAMP1_STARTb signal (which is the inverse or complement of a RAMP1_START signal), and a second current electrode coupled to a first circuit node 23. Transistor 26 has a first current electrode coupled to node 23, a control electrode coupled to receive RAMP1_STARTb, and a second current electrode coupled to a second supply voltage (e.g. ground, depicted with the ground symbol). Capacitor 28 has a first terminal coupled to node 23 and a second terminal coupled to the second supply voltage. Programmable capacitor 30 has a first terminal coupled to node 23 and a second terminal coupled to the second supply voltage. Transistor 20 has a first current electrode coupled to the first supply voltage and a control electrode (i.e. control gate) coupled to receive Vbias. Transistor 24 has a first current electrode coupled to a second current electrode of transistor 20, a control electrode coupled to receive a RAMP2_STARTb signal (which is the inverse or complement of a RAMP2_START signal), and a second current electrode coupled to a second circuit node 25. Transistor 32 has a first current electrode coupled to node 25, a control electrode coupled to receive RAMP2_STARTb, and a second current electrode coupled to the second supply voltage. Capacitor 34 has a first terminal coupled to node 25 and a second terminal coupled to the second supply voltage.

Programmable capacitor 36 has a first terminal coupled to node 25 and a second terminal coupled to the second supply voltage. Node 23 provides Vtemp_ramp1 and node 25 provides Vtemp_ramp2.

Comparison circuitry 37 is coupled to receive Vtemp and a calibration voltage, Vcalib, and is coupled to each of nodes 23 and 25, and provides a signal Stop_Vtempcnt to counter 54. Comparison circuitry 37 includes a multiplexer (MUX) 38, a buffer 80, comparators 40 and 44, switch circuits 82, 84, 86, 88, 90, and 92, inverters 42 and 46, and XOR gate 48. MUX 38 receives Vcalib at a first input and Vtemp at a second input, and has an output coupled to a first input of switch circuit 82. A first output of switch circuit 82 is coupled to a non-inverting input of buffer 80. A first output of buffer 80 is coupled to a first input of switch circuit 84, and a second output of buffer 80 (which is the complement of the first output of buffer 80) is coupled to a second input of switch circuit 84. A first output of switch circuit 84 is coupled to first inputs of switch circuits 86 and 90, respectively, and a second output of switch circuitry 84 is coupled to a second input of switch circuit 82. A second output of switch circuit 82 is coupled to an inverting input of buffer 80. Buffer 80 is configured to operate as a unity gain buffer.

Continuing with comparison circuitry 37, a first output of switch circuit 86 is coupled to a non-inverting input of comparator 40, and a first output of switch circuit 90 is coupled to a non-inverting input of comparator 44. A first input of switch circuit 86 is coupled to node 23 and thus receives Vtemp_ramp1, and a first input of switch circuit 90 is coupled to note 25 and thus receives Vtemp_ramp2. A second output of switch circuit 86 is coupled to an inverting input of comparator 40, and a second output of switch circuit 90 is coupled to an inverting input of comparator 44. A first output of comparator 40, referred to as "outb" of comparator 40, is coupled to a first input of switch circuit 88, and a first output of comparator 44, referred to as "outb" of comparator 44, is coupled to a first input of switch circuit 92. A second output of comparator 44, referred to as "out" of comparator 40, is coupled to a second input of switch circuit 88, and a second output of comparator 44, referred to as "out" of comparator 44, is coupled to a second input of switch circuit 92. The first output of each comparator is complementary to (i.e. the inverse of) the second output of the corresponding comparator.

Still continuing with comparison circuitry 37, a first output of switch circuitry 88 is coupled to an input of inverter 42, and an output of inverter 42 is coupled to provide Stop_Vtempcnt1 to a first input of XOR 48. A second output of switch circuit 92 is coupled to an input of inverter 46, and an output of inverter 46 is coupled to provide Stop_Vtempcnt2 to a second input of XOR 48. An output of XOR 48 provides Stop_Vtempcnt to digital counter 54. Comparators 40 and 44 and XOR 48 operate as pulse generation circuitry which generates pulses based on comparisons of Vtemp with each of Vtemp_ramp1 and Vtemp_ramp2.

Switch circuits 82, 84, 86, 88, 90, and 92 each receive a switch signal at a control input of the switch circuitry which places a corresponding switch circuit into a first switch state or a second switch state, depending on the value of the switch signal. In one embodiment, as asserted switch signal places the corresponding switch circuit into a first switch state, and a negate switch signal places the corresponding switch circuit into a second switch state. For each switch circuit, when the switch circuit is in the first switch state, the switch circuit provides a path between the first input and the first output of the switch circuit and a path between the second input and the second output of the switch circuit. In the first switch state, the switch circuit does not provide a path between the first input and the second output of the switch circuit, and the switch circuit does not provide a path between the second input and the first output of the switch circuit. For each switch circuit, when the switch circuit is in the second switch state, the switch circuit provides a path between the first input and the second output of the switch circuit and a path between the second input and the first output of the switch circuit. In the second switch state, the switch circuit does not provide a path between the first input and the first output of the switch circuit, and the switch circuit does not provide a path between the second input and the second output of the switch circuit. Any circuitry may be used to implement the switch circuits.

Digital counter 54 has a clock input to receive an accurate, on-chip clock. In one embodiment, this on-chip clock is provided by a crystal which ensures its accuracy. In the current embodiment, it will be assumed that this clock has a frequency of 24 MHz, and therefore will be referred to as 24Mclk. However, in alternate embodiments, other clock frequencies may be used. Inverter 52 receives STARTb and provides START to digital counter 54. Digital counter 54 receives Stop_Vtempcnt, and provides RAMP1_START, RAMP2_START, Vtempcnt, and SWITCH. Digital counter 54 is described in further detail in FIG. 6.

Figure 6:
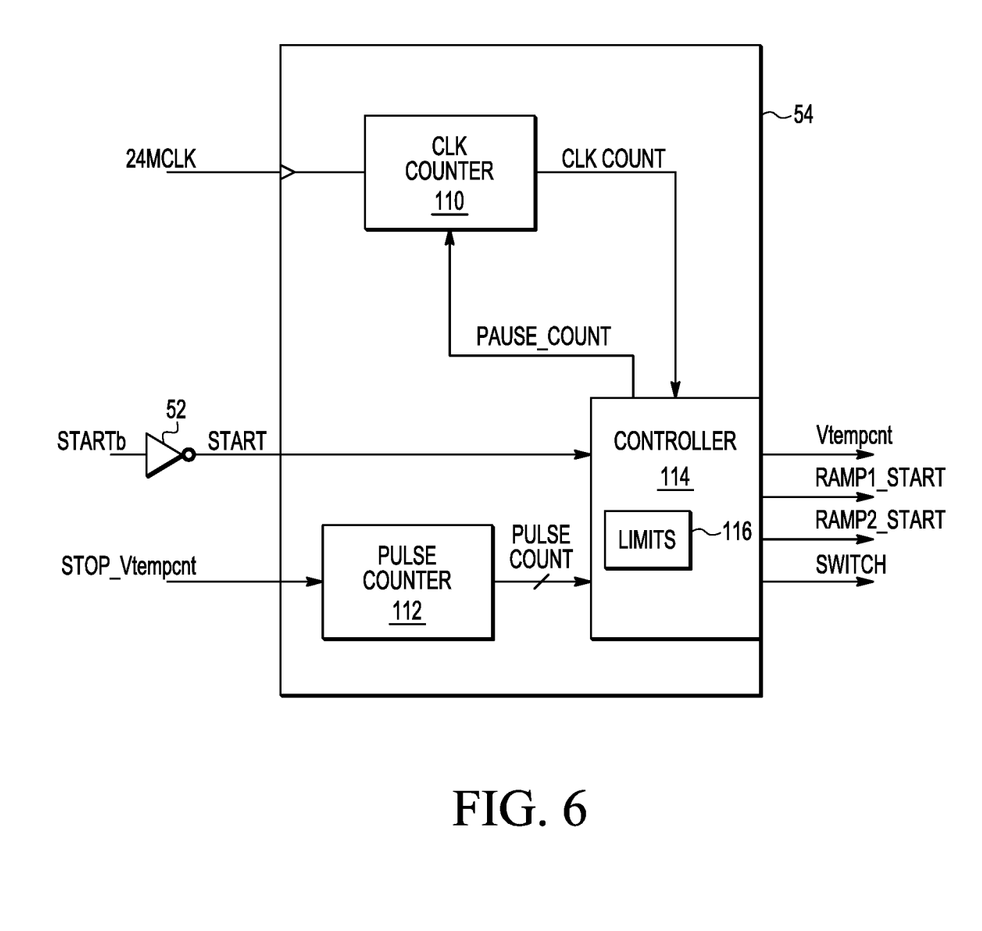
FIG. 6 illustrates, in block diagram form, one embodiment of the counter circuitry of FIG. 1, in accordance with one embodiment of the present invention.

Referring to FIG. 6, digital counter 54 includes a clock (clk) counter 110 which counts clock cycles (e.g. rising edges) of 24MCLK and a pulse counter 112, which counts pulses (e.g. rising edges) on Stop_Vtempcnt. Digital counter 54 also includes a controller 114 which includes storage circuit 116 configured to store one or more limits. Clk counter 110 provides a clk count to controller 114. START is provided to controller 114. Pulse counter 112 provides a pulse count to controller 114. Controller 114, based on comparing the received pulse count to an appropriate limit value, provides a pause_count signal to clk counter 110. In response to pause_count signal being asserted, clk counter 110 pauses its counting of clock cycles of 24MCLK, but the count value of clk counter 110 is not reset. That is, once the pause_count signal is again negated, clk counter 110 continues counting from where it left off when the pause_count signal was asserted.

In one embodiment, when START is asserted, the clk counter 110 begins counting clock cycles of 24MClk. Once pulse counter 112 has received a predetermined number, y, of pulses (e.g. rising edges) on Stop_Vtempcnt, START is negated (i.e. de-asserted) and the output, Vtempcnt, provides a count of the number of cycles of 24MClk which occurred within the time period defined by the y pulses of Stop_Vtempcnt. In the illustrated embodiment, y=32 such that clock counter 110 is set to count the number of cycles of 24MClk which occur in the time period defined by 32 pulses of Stop_Vtempcnt. Note that the value of y may be stored in storage circuitry 116. Controller 114 may change the state of switch during a measurement operation after pulse counter 112 counts a number of pulses, z, that is less than y. In one embodiment, z=16 such that the switch signal, in a first phase of the measurement operation, has a first value until pulse counter 112 counts z pulses, and then, in a second phase of the measurement operation, the switch signal is changed to a second value, opposite the first value, for the remaining y-z pulse counts. In one embodiment, when pulse counter 112 has counted z pulses, controller 114 asserts the pause_count signal until the switch circuits have completed changing switch states in response to the change in the switch signal. At this point, controller 114 negates the pause_count signal to allow clk counter 110 to continue counting.

Also, each time a pulse on Stop_Vtempcnt is received, RAMP1_START and RAMP2_START are alternately asserted and negated (i.e. de-asserted) by controller 114. For example, when START is asserted, RAMP1_START is asserted (set to a logic level 1) and RAMP2_START is negated (cleared to a logic level 0). Upon receiving an initial pulse of Stop_Vtempcnt, RAMP1_START is negated and RAMP2_START is asserted. Then upon receiving a subsequent pulse of Stop_Vtempcnt, RAMP1_START is again asserted and RAMP2_START is again negated. This continues until START is negated. Operation of FIGS. 1 and 6 will be described further in reference to FIGS. 2, 4, and 5 below. Note that negative logic rather than positive logic may be used for any of the signals. For example, rather than detecting or counting rising edges, counters of counter 54 may detect or count falling edges.

Figure 2:
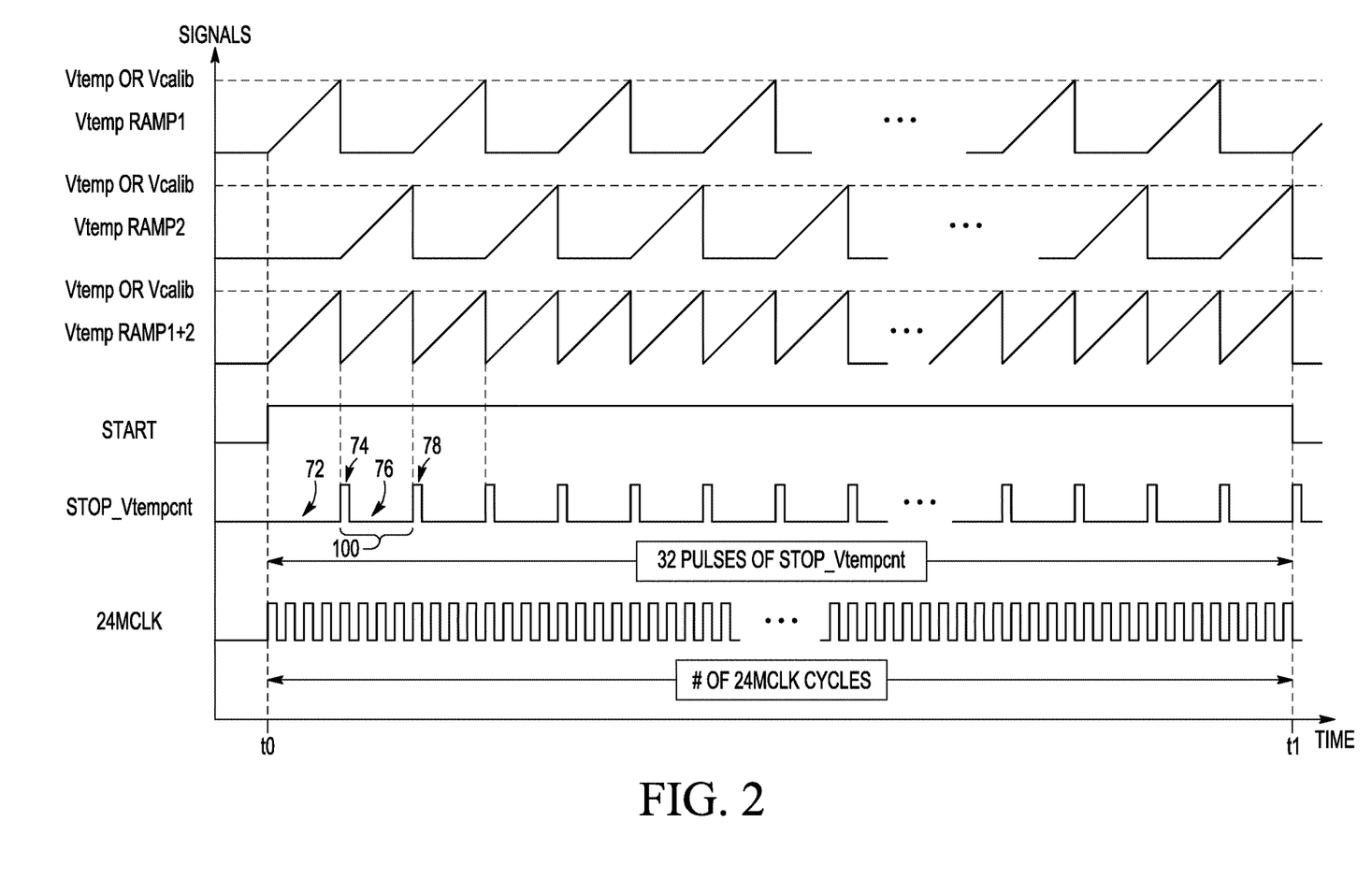
FIG. 2 illustrates, in timing diagram form, various signals in the temperature sensor of FIG. 1, in accordance with one embodiment of the present invention assuming the switch circuits of FIG. 1 were fixed with respect to inputs and outputs.

In operation, ramp generation circuitry 11 alternately generates twin voltage ramp slopes, offset in time, at nodes 23 and 25, respectively, in which the slope of each ramp is determined by current (I)/capacitance (C). For example, as seen in FIG. 2, Vtemp_ramp1 at node 23 ramps up with a predetermined slope while Vtemp_ramp2 is at 0, and then Vtemp_ramp2 at node 25 ramps up with a predetermined slope while Vtemp_ramp1 is at 0. Vtemp_ramp1 and Vtemp_ramp2 alternate with one ramping (i.e. being enabled) while the other is held at ground. Transistors 18 and 20 operate as current sources which provide a current Iramp1 and Iramp2, respectively, based on Vbias. Therefore, Vbias provides for programmable currents Iramp1 and Iramp2 in which the values of Iramp1 and Iramp2 can be set by Vbias.

Iramp1 is directed down through capacitors 28 and 30 by transistor 22, when enabled (i.e. turned on), and Iramp2 is directed down through capacitors 34 and 36 by transistor 24, when enabled (i.e. turned on). Therefore, when transistor 22 is enabled, Iramp1 charges capacitors 28 and 30, resulting in Vtemp_ramp1 at node 23. The slope of Vtemp_ramp1 is determined by Iramp1/$C_{28,30}$, in which $C_{28,30}$ is the sum of the capacitance of capacitors 28 and 30. When transistor 22 is on, transistor 26 is off. However, when transistor 22 is off, transistor 26 is on, pulling node 23 to ground. This resets the voltage across capacitors 28 and 30. Likewise, when transistor 24 is enabled, Iramp2 charges capacitors 34 and 36, resulting in Vtemp_ramp2 at node 25. The slope of Vtemp_ramp2 is determined by Iramp2/$C_{34,36}$, in which $C_{34,36}$ is the sum of the capacitance of capacitors 34 and 36. When transistor 24 is on, transistor 32 is off. However, when transistor 24 is off, transistor 32 is on, pulling node 25 to ground. This resets the voltage across capacitors 34 and 36. Note that ramp generation circuitry 11 is enabled or started by assertion of START. This turns off transistor 16 so that VDD is no longer coupled to the control electrodes of transistors 18 and 20, thus allowing transistors 18 and 20 to be controlled by Vbias.

With respect to comparison circuitry 37 and with respect to the discussion of FIG. 2 that follows, it is assumed that all switch circuits are fixed with respect to their inputs and outputs into the first switch state. For example, each first input of a switch circuit is provided as the first output of the switch circuit, and each second input of the switch circuit is provided as the second output of the switch circuit. That is, the switch signal is not used in this initial discussion (or is fixed to set all switch circuits to the first switch state). Referring to FIG. 1, comparison circuitry 37 generates pulses based on Vtemp_ramp1 and Vtemp_ramp2 hitting a voltage level selected by MUX 38. When MUX 38 selects Vtemp (during an operational phase), the pulses are generated based on Vtemp_ramp1 and Vtemp_ramp2 hitting Vtemp. The voltage, Vtemp, is a temperature dependent voltage in that it changes in relationship with temperature. For example, Vtemp may correspond to a base-emitter voltage (Vbe) of a diode-connected Bipolar Junction Transistor (BJT), where the Vbe varies with temperature. Other temperature dependent voltages may be used. During normal operation (as opposed to calibration, which will be discussed below), MUX 38 selects Vtemp and Vtemp is provided through unity gain buffer 80. Comparator 40 compares Vtemp_ramp1 (coupled to the inverting input of comparator 40 via switch circuit 86) with Vtemp (coupled to the non-inverting input of comparator 40 via switch circuit 86), and comparator 44 compares Vtemp_ramp2 (coupled to the inverting input of comparator 44 via switch circuit 90) with Vtemp (coupled to the non-inverting input of comparator 44 via switch circuit 90). With respect to each of comparators 40 and 44, so long as the inverting input is lower than the non-inverting input, the output of the comparator is high (e.g. a logic level 1). However, when the inverting input matches or surpasses the non-inverting input, the output of the comparator goes low (e.g. a logic level 0).

FIG. 2 illustrates, in timing diagram form, various signals of temperature sensor 10. Operation of FIG. 1 will be described in combination with the timing diagram of FIG. 2. Therefore, referring to comparator 40, the first output (provided as the first output of switch circuit 88) is initially high (since Vtemp_ramp1 starts at 0 after having been reset) and remains high until Vtemp_ramp1 reaches Vtemp. At this point, the first output of comparator 40 goes low and the output of inverter 42, Stop_Vtempcnt1, goes high at the first input of XOR 48. While Vtemp_ramp1 is ramping, Vtemp_ramp2 is held at ground, therefore, the first output of comparator 44 (provided as the first output of switch circuit 92) is also 1. The output of inverter 46, Stop_Vtempcnt2, is 0. At the beginning of either Vtemp_ramp1 or Vtamp_ramp2, the inputs to XOR 48 are 0, and therefore, the output of XOR 48, Vtempcnt, is 0, as can be seen at point 72 on FIG. 2. Assuming Vtemp_ramp1 is enabled, when Vtemp_ramp1 reaches Vtemp, the first output of comparator 40 goes low and the output of inverter 42 goes high. At this point, the output of XOR 48 changes state and becomes a 1, as seen at point 74 on FIG. 2.

Each time the output of XOR 48 goes high (e.g. with each rising edge of Stop_Vtempcnt), controller 114 of counter 54 alternately asserts and negates RAMP1_START and RAMP2_START, as described above. That is, when a rising edge of Stop_Vtempcnt is received by counter 54, counter 54 negates the start signal of the currently enabled ramp, RAMP1_START for this example, and asserts the start signal for the other ramp, RAMP2_START for this example. Therefore, RAMP1_STARTb goes high and pulls node 23 to ground, and RAMP2_STARTb goes low, turning on transistor 24 and enabling ramp2. With node 23 pulled to ground and ramp2 beginning at 0, the first outputs of comparators 40 and 44 are 1, with the output of XOR 48 being 0, as seen at point 76 on FIG. 2. This time, when Vtemp_ramp2 reaches Vtemp, the first output of comparator 44 goes low, causing the output of XOR 48 to go high, as seen at point 78 of FIG. 2. This results in another rising edge (another pulse) on Stop_Vtempcnt. This alternating of ramps continues until pulse counter 112 of counter 54 counts 32 pulses of Stop_Vtempcnt. When 32 pulses of Stop_Vtempcnt has occurred, START is negated and the output of counter 54, Vtempcnt, provides the count of how many 24MClk pulses (provided by clk counter 110) occurred during the count of 32 pulses of Stop_Vtempcnt. Note that the period 100 refers to the time between rising edges of sequential pulses, such as sequential pulses 74 and 78. Period 100 remains fairly constant throughout the measurement operation (between the assertion and subsequent negation of the START signal).

As illustrated in FIG. 2, START is asserted at time t0. Vtemp_ramp1 and Vtemp_ramp2 are alternately enabled with a pulse being generated on Stop_Vtempcnt each time the enabled ramp reaches Vtemp. At time t1, 32 pulses of Stop_Vtempcnt have been detected by counter 54 and therefore START is negated (i.e. de-asserted). The output, Vtempcnt, of counter 54 provides the number of 24MClk pulses which occurred during the time period t1-t0. This value (due to the fact that the 24MClk is accurate) provides the time duration of 32 ramp-ups from 0 to Vtemp. Therefore, digital counter 54 provides a digital output value (Vtempcnt) in response to an input temperature dependent voltage (Vtemp). With each ramp having a known slope (the calibration of which will be described below), the digital outputs of counter 54 each correspond to a sensed temperature value. Therefore, a relationship can be set up between the temperature and the digital output of counter 54. In this manner, a lookup table or a mathematical formula can be used to convert the digital output of counter 54 to provide the corresponding sensed temperature.

Figure 3:
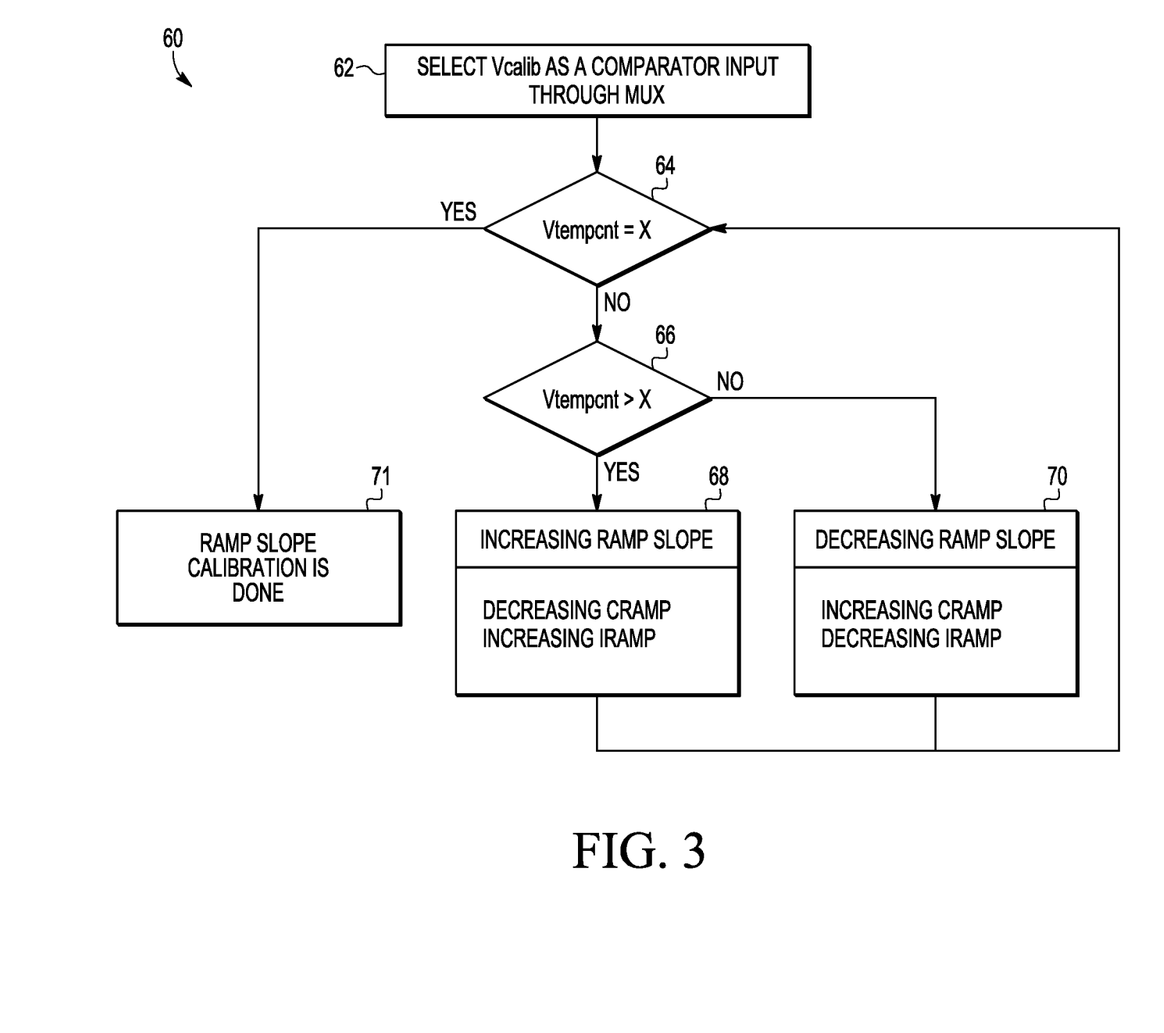
FIG. 3 illustrates, in flow diagram form, a method for calibration of the temperature sensor of FIG. 1, in accordance with one embodiment of the present invention.

During calibration by temperature sensing circuit 10, the slope of the ramps are set by testing against a known test voltage at a predetermined temperature and adjusting Cramp (the capacitance of each programmable capacitor 30 and 36) and Iramp until the output of counter 54, Vtempcnt, matches a number of 24 MClk cycles for the test voltage at the predetermined temperature. FIG. 3 illustrates a method 60 of calibrating the ramp slopes in accordance with one embodiment of the present invention. Method 60 begins with block 62 in which a calibration voltage (Vcalib) is selected by MUX 38 (during the calibration phase) as the voltage provided to the non-inverting inputs of comparators 40 and 44 via unity gain buffer 80 and via switch circuits 86 and 90, respectively. In one embodiment, Vcalib can be provided by an on-chip power supply. With Vcalib selected, temperature sensing circuit 10 is allowed to operate by asserting START and, after 32 pulses of Stop_Vtempcnt, provides Vtempcnt. Method 60 proceeds to decision diamond 64 in which it is determined whether Vtempcnt is equal to x. Note that x represents the number of 24MClk cycles expected for the test voltage at 25 degrees Celsius. Alternatively, x can be selected to represent the number of 24MClk cycles (or other clock cycles) for the test voltage at a different temperature. If Vtempcnt does not equal x, method 60 proceeds to decision diamond 66.

If Vtempcnt is greater than x, the ramp slope of Vtemp_ramp1 and Vtemp_ramp2 is increased (block 68) by decreasing the capacitance of programmable capacitors 30 and 36, increasing Iramp1 and Iramp2 by adjusting Vbias, or both. If Vtempcnt is less than x, the ramp slope of Vtemp_ramp1 and Vtemp_ramp2 is decreased (block 70) by increasing the capacitance of programmable capacitors 30 and 36, decreasing Iramp1 and Iramp2 by adjusting Vbias, or both. After the adjustments have been made to increase or decrease the ramp slope, temperature sensing circuit 10 operates again by asserting START (with Vcalib still selected by MUX 38). Again, Vtempcnt is checked against x at diamond 64. Method 60 continues, adjusting the ramp slopes as needed, until Vtempcnt matches x. When they match, calibration is complete (block 71) and the values of capacitors 30 and 36 and Iramp1 and Iramp2 have been properly selected. Therefore, the ramp slopes are calibrated such that when Vtempcnt matches x, the voltage Vcalib is indicated. With this information, a relationship can be set up between the sensed temperature dependent voltage Vtemp and the digital output of counter 54.

Figure 4:
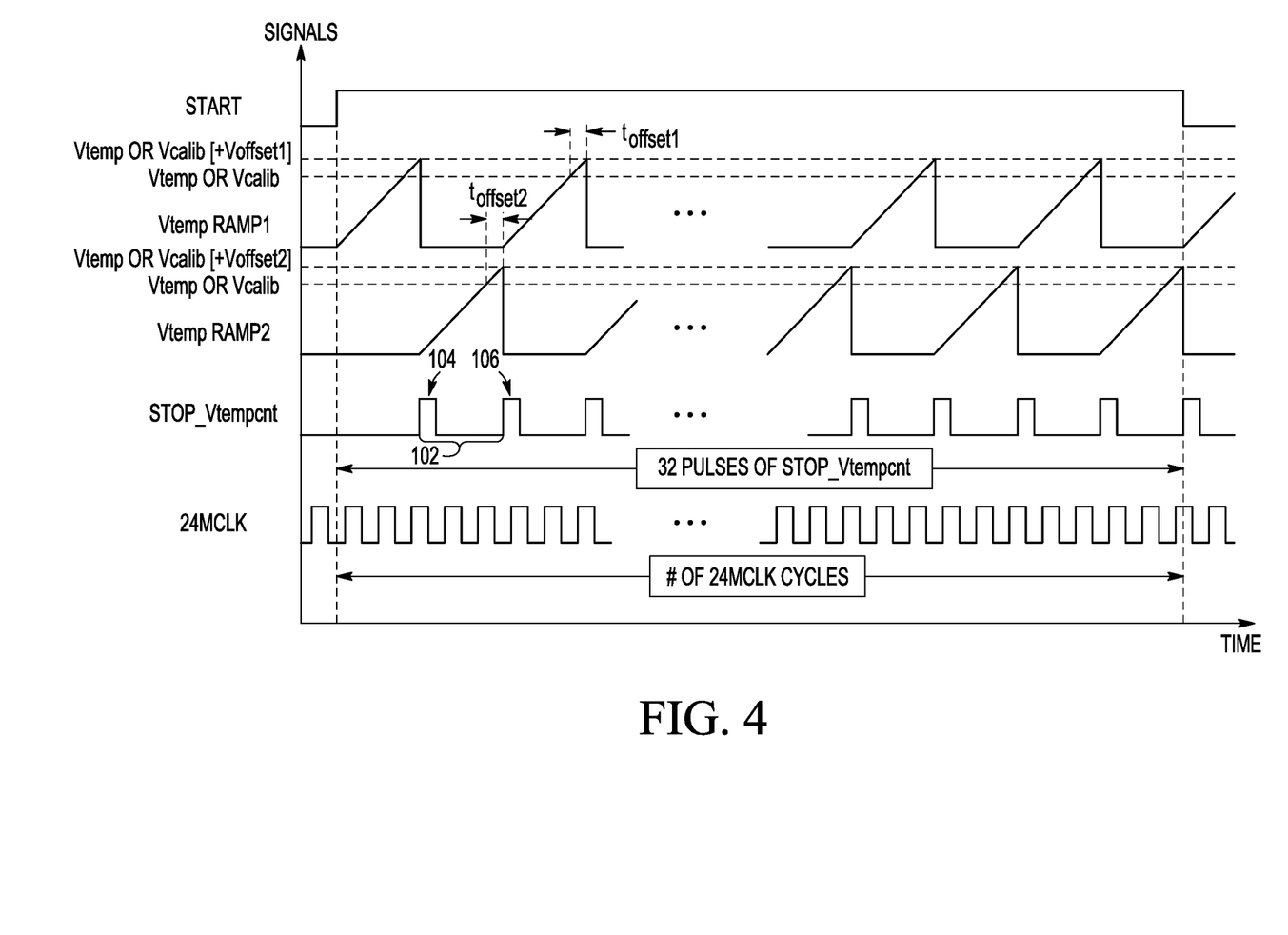
FIG. 4 illustrates, in timing diagram form, various signals in the temperature sensor of FIG. 1, when no or insufficient offset cancellation is provided.

FIG. 4, in timing diagram form, various signals in the temperature sensor of FIG. 1, when no or insufficient offset cancellation is provided. FIG. 2 described operation of FIG. 1 under an ideal situation in which it is assumed that buffer 80 and comparators 40 and 44 do not include an internal offset. However, each of these elements may include internal offsets, which can operate to shift the pulse generation on Stop_Vtempcnt. For example, referring to the first wave form corresponding to Vtemp_ramp1 of FIG. 4, an overall positive offset introduced by buffer 80 and comparator 40 causes a forward time shift of $t_{offset1}$ in detecting when Vtemp_ramp1 hits Vtemp, thus Vtemp_ramp1 actually reaches Vtemp+Voffset1. Voffset1 corresponds to the added voltage, beyond Vtemp, as a result of the introduced positive offset. The same applies to Vtemp_ramp1 in the second waveform of FIG. 4. That is, an overall offset introduced by buffer 80 and comparator 40 causes a forward time shift of $t_{offset2}$ in detecting when Vtemp_ramp2 hits Vtemp, thus Vtemp_ramp2 actually reaches Vtemp+Voffset2. Voffset2 corresponds to the added voltage, beyond Vtemp, as a result of the introduced positive offset. Pulses 104 and 106 are therefore alternately generated when Vtemp_ramp1 hits Vtemp+Voffset1 and when Vtemp_ramp2 hits Vtemp+Voffset2. This results in a period 102, corresponding to the time between rising edges of sequential pulses on Stop_Vtempcnt (e.g. pulses 106 and 106).

Period 102 is greater than period 100 of FIG. 2, which assumes an ideal situation with no introduced offset by the buffer or comparator. Since the temperature sensing depends on the number of 24MClk pulses which occur during y pulses of Stop_Vtempcnt, the accuracy of the final count of 24MClk pulses at the time START is negated (corresponding to Vtempcnt output by counter 54) would be less, resulting in a higher Vtempcnt at the same temperature as compared to the ideal situation of FIG. 2. Thus the higher Vtempcnt due to the internal offsets would result in reduced accuracy of the temperature sensing. Note that the same applies if, instead, the buffer and comparators resulted in an overall negative offset, shifting the time back by $t_{offset1}$ and $t_{offset2}$, rather than forward, resulting in alternately generating pulses of STOP_Vtempcnt when Vtemp_ramp1 hits Vtemp-Voffset1 and when Vtemp_ramp2 hits Vtemp-Voffset2. In this case, the resulting period between rising edges of sequential pulses on Stop_Vtempcnt would be less than period 100 of FIG. 2. The accuracy of Vtempcnt would again be less, resulting in a lower Vtempcnt at the same temperature as compared to the ideal situation of FIG. 2.

Figure 5:
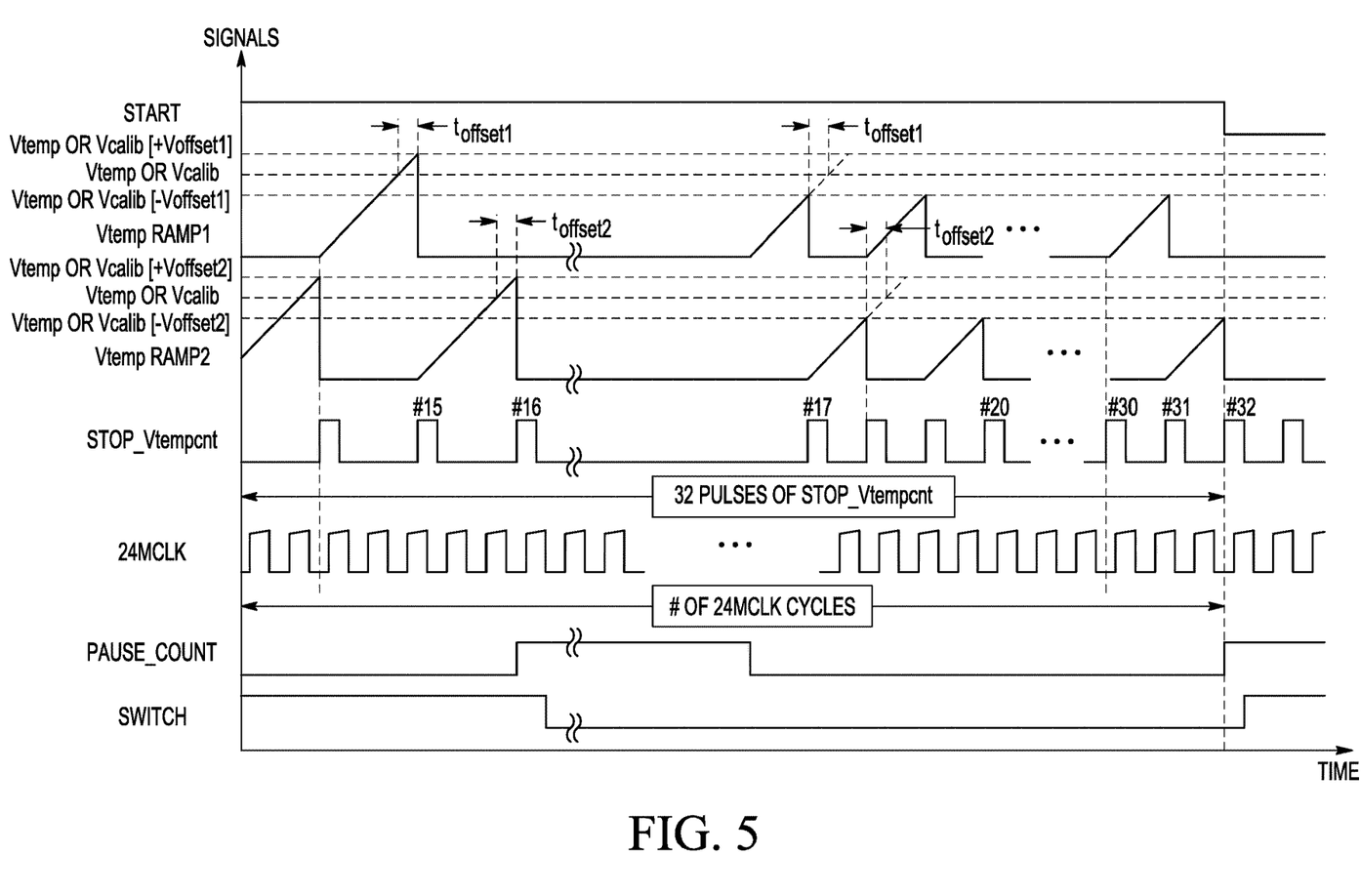
FIG. 5 illustrates, in timing diagram form, various signals in the temperature sensor of FIG. 1, in accordance with one embodiment of the present invention, in which offset cancellation is provided through the use of the switch circuits of FIG. 1.

FIG. 5 illustrates, in timing diagram form, various signals in the temperature sensor of FIG. 1, in accordance with one embodiment of the present invention in which offset cancellation is provided through the use of the switch circuits of FIG. 1. Unlike the operation of FIG. 1 described in reference to FIG. 2, in FIG. 5, the switch signal is used to change the switch states of the switch circuits during a measurement operation, in which the switch circuits are in one switch state (e.g. the first switch state) for a first phase of the measurement operation and in another switch state (e.g. the second switch state) for a second phase of the measurement operation. In the illustrated embodiment, the switch signal is changed after half of the y pulses of Stop_Vtempcnt are received, corresponding to 16 in the illustrated embodiment.

Note that this value, referred to as z above, can also be stored in storage circuitry 116 or can be determined from the value y.

In the illustrated embodiment of FIG. 5, as in FIG. 4, it is assumed that the buffer and comparators introduce an internal offset which results in forward time offsets, $t_{offset1}$ due to buffer 80 and comparator 40 and $t_{offset2}$ due to buffer 80 and comparator 44. Also, in FIG. 5, it is assumed that START was asserted earlier to start ramps Vtemp_ramp1 and Vtemp_ramp2, therefore, START is already asserted at the beginning of FIG. 5. Also, for the beginning part of FIG. 5, the switch signal is set to a first value which configures all switch circuits to the first switch state (for the first phase of the measurement operation), and pause_count is negated to allow counter 110 to count the clock cycles of 24MCIk. In FIG. 5, note that 13 pulses of Stop_Vtempcnt has already occurred, and FIG. 5 starts with pulse #14 of Stop_Vtempcnt. For previous pulses #1-13 and pulses #14-16 of Stop_Vtempcnt, START is asserted, the switch signal is at the first value, and pause_count is negated. Therefore, as described in FIG. 4, pulses 1-16 of Stop_Vtempcnt actually occur when each ramp hits Vtemp+Voffset1 or Vtemp+Voffset2, due to the internal offsets introduced by the buffer and comparators. Pulses #1-16 correspond to the first phase of the measurement operation.

Upon occurrence of pulse #16 of Stop_Vtempcnt, which is half way of the total 32 pulses needed for a full measurement operation in the current embodiment, pause_count is asserted to pause clock counter 110 from counting cycles of 24MCIk. Controller 114 receives the pulse count from pulse counter 112, and when that pulse count reaches 16 (at the rising edge of pulse #16), controller 114 asserts pause_count. Also, upon reaching pulse #16, RAMP1_START and RAMP2_START are negated to stop Vtemp_ramp1 and Vtemp_ramp2 from being generated, which also stops the generation of pulses on Stop_Vtempcnt. Therefore, in one embodiment, RAMP1_START and RAMP2_START may be generated based on pause_count in combination with START.

After asserting pause_count, controller 114 changes the value of switch to a second value, opposite the first value, to enter the second phase of the measurement operation. This reconfigures all switch circuits from the first switch state to the second switch state such that the inputs to buffer 80 and comparators 40 and 44, and the outputs of buffer 80 and comparators 40 and 44 are swapped. Therefore, in the second switch state, unlike when the switch circuits are configured to the first switch state, Vtemp (at the first input of switch 82) is now provided to the inverting input of buffer 80 (at the second output of switch 82), and the first output of switch circuit 84 is now provided to the non-inverting input of buffer 80 (at the first output of switch 82). The second output of buffer 80 is now provided as the first output of switch circuit 84 which is coupled to the first inputs of switch circuits 86 and 90. Vtemp is provided to the inverting input of comparator 40 via the second output of switch circuit 86, and Vtemp_ramp1 is provided to the non-inverting input of comparator 40 via the first output of switch circuit 86. Similarly, Vtemp is provided to the inverting input of comparator 44 via the second output of switch circuit 90, and Vtemp_ramp2 is provided to the non-inverting input of comparator 44 via the first output of switch circuit 90. Also, out of comparator 40 is provided to inverter 42 via the first output of switch circuit 88, and out of comparator 44 is provided to inverter 46 via the first output of switch circuit 92. In this manner, the offsets introduced by buffer 80 and comparators 40 and 44 are reversed in direction. Rather than the offsets resulting in forward time shifts, they result now in backward time shifts due to the switch circuits being in the second switch state. If the offsets result in backwards time shifts with the switch circuits in the first switch state, then the offsets would result in forward time shifts with the switch circuits in the second switch state.

Controller 114 provides some time for the reconfiguring of the switch circuits from the first switch state to the second switch state to settle, as illustrated by the breaks in the signals of FIG. 5 after pulse #16. Once sufficient time is provided, controller 114 negates pause_count and asserts RAMP1_START again. Controller 114 again alternately asserts and negates RAMP1_START and RAMP2_START with each pulse of Stop_Vtempcnt, as described above. After the switch circuits have been reconfigured from the first switch state to the second switch state, a backward shift of $t_{offset1}$ and $t_{offset2}$ occurs for each of Vtemp_ramp1 and Vtemp_ramp2, respectively. When the first ramp of Vtemp_ramp1 hits Vtemp-Voffset1, pulse #17 of Stop_Vtempcnt is generated. Pulses #17-32 are generated each time Vtemp_ramp1 or Vtemp_ramp2 hits Vtemp-Voffset1 or Vtemp-Voffset2, respectively. Pulses #17-32 correspond to the second phase of the measurement operation. Upon occurrence (e.g. the rising edge) of pulse #32 of Stop_Vtempcnt, which signifies the end of the measurement operation, pause_count is again asserted to stop clock counter 110 from counting cycles of 24MCIk, and START is negated. At this point, Vtempcnt is output by controller 114, corresponding to the final clk count of clk counter 110, in which Vtempcnt provides a digital indication of the measured temperature. In response to START being negated, RAMP1_START and RAMP2_START are also negated. After pause_count is asserted or START is negated, the switch signal can be changed back to the first value so as to reconfigure all the switch circuits back to the first switch state from the second switch state.

In the embodiment of FIG. 5, the switch signal reconfigures the switch circuits after half of the pulses of Stop_Vtempcnt have been generated. That is, each of the first and second phases of the measurement operation correspond to half of the measurement operation. However, in alternate embodiments, the first phase may correspond to z pulses, in which z can be any value less than y. In this case, the switch signal would change in value after z pulses for the remaining y-z pulses. Also, note that the calibration method described above with respect to FIG. 3 can be done using the switch circuits and switch signal as well. In this manner, the calibration can be performed with offset cancellation.

In alternate embodiments, switch circuits 88 and 92 can be located as circuitry within comparators 40 and 44, respectively. Similarly, switch circuits 86 and 90 can be located as circuitry within comparators 40 and 44, respectively. Also, instead of using switch circuits 88 and 92 and inverters 42 and 46, the first and second output of each comparator can alternately be provided as Stop_Vtempcnt1 and Stop_Vtempcnt2. For example, for the first phase of the measurement operation, the second output, out, of comparator 40 can be provided as Stop_Vtempcnt1 to the first input of XOR 48 and the second output, out, of comparator 44 can be provided as Stop_Vtempcnt2 to the second input of XOR 48. For the second phase of the measurement operation, the first output, outb, of comparator 40 can be provided as Stop_Vtempcnt1 to the first input of XOR 48 and the first output, outb, of comparator 44 can be provided as Stop_Vtempcnt2 to the first input of XOR 48. In yet another embodiment, instead of switch circuits 88 and 92, a switch can be provided around each of inverters 42 and 46 which can selectively bypass each inverter. For example, during the first phase of the measurement operation, the switches around the inverters can be set such that they are not shorted out and thus operate to invert the output of the corresponding comparator. In this example, during a second phase of the measurement operation, the switches can be set such that they short out the inverters and the outputs of the comparators are provided directly to XOR gate 48. Therefore, the functionality of switches 88 and 92 can be implemented in many different ways.

Therefore, by now it can be appreciated how a temperature sensor provides a digital value indicative of the sensed temperature using alternating twin $1^{st}$-order temperature independent single slope ramp voltage references and counter circuits. Furthermore, by reconfiguring switch circuits for different phases of the temperature measurement operation in order to swap inputs and outputs of buffers and comparators used in the temperature sensing circuitry, offsets introduce by these buffers and comparators can effectively be canceled. This prevents the offset errors introduced by these elements from being cumulative, and thus improving accuracy of the final sense temperature.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a lowercase "b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Also for example, in one embodiment, the illustrated elements of system 10 are circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the alternating twin slope ramps may be generated by different circuitry and the comparison circuitry may include different or additional circuitry to perform the comparisons with the ramps and to generate the pulses. Additionally, different type counters may be used to implement the functionality of the digital counter. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a temperature sensor includes ramp generation circuitry including a ramp generator, the ramp generator including a ramp output to provide a ramp signal and pulse generation circuitry. The pulse generation circuitry includes a switch circuit including a first input coupled to the ramp output, a second input coupled to receive a comparison voltage, a first output, and a second output, wherein in a first switch state, the switch circuit provides a path between the first input and the first output and does not provide a path between the first input and the second output, wherein in the first switch state, the switch circuit provides a path between the second input and the second output and does not provide a path between the second input and the first output, and wherein in a second switch state, the switch circuit provides a path between the second input and the first output and does not provide a path between the second input and the second output, wherein in the second switch state, the switch circuit provides a path between the first input and the second output and does not provide a path between the first input and the first output. The pulse generation circuitry also includes a comparator including a first input coupled to the first output of the switch circuit and a second input coupled the second output of the switch circuit, and an output, wherein during a temperature measurement operation, the comparison voltage is indicative of a measured temperature and the output of the pulse generation circuitry provides a pulse signal that is indicative of the measured temperature. The temperature sensor also includes counter circuitry including an input coupled to the output of the pulse generation circuitry and including an output to provide a digital indication of the measured temperature during a temperature measuring operation. In one aspect of the above embodiment, during a first phase of a temperature measurement operation, the switch circuit is in the first switch state and during a second phase of a temperature measurement operation, the switch circuit is in the second switch state. In a further aspect, the digital indication is based on pulses provided by the comparator during the first phase and during the second phase of a temperature measurement operation. In another aspect, the ramp generation circuitry includes a second ramp generator including a second ramp output to provide a second ramp signal, and the pulse generation circuitry includes a second switch circuit including a first input coupled to the second ramp output, a second input coupled to receive the comparison voltage, a first output, and a second output, wherein in a first switch state, the second switch circuit provides a path between the first input and the first output and does not provide a path between the first input and the second output, wherein in the first switch state, the second switch circuit provides a path between the second input and the second output and does not provide a path between the second input and the first output, wherein in a second switch state, the second switch circuit provides a path between the second input and the first output and does not provide a path between the second input and the second output, wherein in the second switch state, the second switch circuit provides a path between the first input and the second output and does not provide a path between the first input and the first output, and a second comparator including a first input coupled to the first output of the second switch circuit and a second input coupled the second output of the second switch circuit. In another aspect of the above embodiment, the comparator includes a first output and a second output, wherein the second output is a complementary output to the first output, and the pulse generation circuitry includes a second switch circuit, the second switch circuit including a first input coupled to the first output of the comparator and a second input coupled to the second output of the comparator, the second switch circuit including a first output, wherein in a first switch state, the second switch circuit provides a path between the first input and the first output and does not provide a path between the second input and the first output, wherein in a second switch state, the first switch circuit provides a path between the second input and the first output and does not provide a path between the first input and the first output. In a further aspect, during a first phase of a temperature measurement operation, the second switch is in a first switch state and during a second phase of a temperature measurement operation, the second switch is in a second switch state. In yet another aspect, during a temperature measurement operation, the switch circuit switches from the first switch state to the second switch state based on a count by a counter of the counter circuitry of pulses generated by the output of the pulse generation circuitry. In a further aspect, the counter circuitry pauses the counter when the switch circuit switches between the first switch state and the second switch state during a temperature measurement operation. In yet another aspect, during a calibration operation, the comparison voltage is an indication of a calibration voltage and the output of the counter circuit provides digital indication of the calibration voltage.

In another embodiment, a method of performing a temperature measurement operation for providing an indication of a measured temperature includes during a first phase of the temperature measurement operation: providing a voltage indicative of a measured temperature to a first input of a comparator; providing a ramp signal to a second input of the comparator; generating at an output of the comparator, pulses based on a comparison of the first input to the second input of the comparator; and during a second phase of the temperature measurement operation: providing the voltage indicative of a measured temperature to the second input of the comparator; providing the ramp signal to the first input of the comparator; generating at an output of the comparator, pulses based on a comparison of the first input to the second input of the comparator. The method further includes utilizing the pulses generated during the first phase and the pulses generated during the second phase to provide a digital indication of the measured temperature. In one aspect, the pulses generated during the first phase are generated at a first output of the comparator and the pulses generated at the second phase are generated at a second output of the comparator, wherein the second output is a complementary output of the first output. In another aspect, the temperature measurement operation transitions from the first phase to the second phase based on a count of a number of pulses generated during the first phase. In another aspect, during the first phase of the temperature measurement operation: providing the voltage indicative of a measured temperature to a first input of a second comparator; providing a second ramp signal to a second input of the second comparator; generating at an output of the second comparator, pulses based on a comparison of the first input to the second input of the second comparator; and during the second phase of the temperature measurement operation: providing the voltage indicative of a measured temperature to the second input of the second comparator; providing the second ramp signal to the first input of the second comparator; generating at an output of the second comparator, pulses based on a comparison of the first input to the second input of the second comparator; and the utilizing includes utilizing the pulses generated by the second comparator during the first phase and the pulses generated by the second comparator during the second phase to provide the digital indication of the measured temperature. In a further aspect, the utilizing further includes: during the first phase, combining the pulses generated by the comparator and the pulse generated by the second comparator; during the second phase, combining the pulses generated by the comparator and the pulse generated by the second comparator. In another aspect, the temperature measurement operation transitions from the first phase to the second phase based on a count of a number of pulses generated by the comparator and the second comparator during the first phase. In a further aspect, the ramp signal includes a series of ramp pulses and the second ramp signal includes a second series of ramp pulses that occur at generally opposite times to the series of ramp pules of the ramp signal. In another aspect of the another embodiment, the method further includes pausing the ramp signal during a transition from the first phase to the second phase. In yet another aspect, the utilizing includes counting by a counter the pulses generated by the comparator during the first phase, pausing the counter during a transition from the first phase to the second phase, and counting by the counter the pulses generated by the comparator during the second phase. In another aspect, the digital indication is based on a time needed to generate the pulses during the first phase and a time needed to generate the pulses during the second phase.

In yet another embodiment, a temperature sensor includes ramp generation circuitry including a ramp generator, the ramp generator including a first ramp output to provide a ramp signal and a second ramp output to provide a second ramp signal; and pulse generation circuitry. The pulse generation circuitry includes a first switch circuit including a first input coupled to the first ramp output, a second input coupled to receive a comparison voltage, a first output, and a second output, wherein in a first switch state, the first switch circuit provides a path between the first input and the first output and does not provide a path between the first input and the second output, wherein in the first switch state, the first switch circuit provides a path between the second input and the second output and does not provide a path between the second input and the first output, wherein in a second switch state, the first switch circuit provides a path between the second input and the first output and does not provide a path between the second input and the second output, wherein in the second switch state, the first switch circuit provides a path between the first input and the second output and does not provide a path between the first input and the first output; a comparator including a first input coupled to the first output of the first switch circuit and a second input coupled the second output of the first switch circuit; a second switch circuit including a first input coupled to the second ramp output, a second input coupled to receive the comparison voltage, a first output, and a second output, wherein in a first switch state, the second switch circuit provides a path between the first input and the first output and does not provide a path between the first input and the second output, wherein in the first switch state, the second switch circuit provides a path between the second input and the second output and does not provide a path between the second input and the first output, wherein in a second switch state, the second switch circuit provides a path between the second input and the first output and does not provide a path between the second input and the second output, wherein in the second switch state, the second switch circuit provides a path between the first input and the second output and does not provide a path between the first input and the first output; a second comparator including a first input coupled to the first output of the second switch circuit and a second input coupled the second output of the second switch circuit; and an output. During a temperature measurement operation, the comparison voltage is indicative of a measured temperature and the output of the pulse generation circuitry provides a pulse signal that is indicative of the measured temperature. During a first phase of a temperature measurement operation, the first switch circuit and the second switch circuit are each in the first switch state and during a second phase of a temperature measurement operation, the first switch circuit and the second switch circuit are each in the second switch state. The temperature sensor also includes counter circuitry including an input coupled to the output of the pulse generation circuitry and including an output to provide a digital indication of the measured temperature during a temperature measuring operation, wherein the digital indication is based on pulses provided by the first comparator and the second comparator during the first phase and during the second phase of a temperature measurement operation

What is claimed is:

1. A temperature sensor comprising:
ramp generation circuitry including a ramp generator, the ramp generator including a ramp output to provide a ramp signal;
pulse generation circuitry including:
a switch circuit including a first input coupled to the ramp output, a second input coupled to receive a comparison voltage, a first output, and a second output, wherein in a first switch state, the switch circuit provides a path between the first input and the first output and does not provide a path between the first input and the second output, wherein in the first switch state, the switch circuit provides a path between the second input and the second output and does not provide a path between the second input and the first output, wherein in a second switch state, the switch circuit provides a path between the second input and the first output and does not provide a path between the second input and the second output, wherein in the second switch state, the switch circuit provides a path between the first input and the second output and does not provide a path between the first input and the first output;
a comparator including a first input coupled to the first output of the switch circuit and a second input coupled the second output of the switch circuit;
an output, wherein during a temperature measurement operation, the comparison voltage is indicative of a measured temperature and the output of the pulse generation circuitry provides a pulse signal that is indicative of the measured temperature;
counter circuitry including an input coupled to the output of the pulse generation circuitry and including an output to provide a digital indication of the measured temperature during a temperature measuring operation.

2. The temperature sensor of claim 1 wherein during a first phase of a temperature measurement operation, the switch circuit is in the first switch state and during a second phase of a temperature measurement operation, the switch circuit is in the second switch state.

3. The temperature sensor of claim 2 wherein the digital indication is based on pulses provided by the comparator during the first phase and during the second phase of a temperature measurement operation.

4. The temperature sensor of claim 1 wherein:
the ramp generation circuitry includes a second ramp generator including a second ramp output to provide a second ramp signal;
the pulse generation circuitry includes:
a second switch circuit including a first input coupled to the second ramp output, a second input coupled to receive the comparison voltage, a first output, and a second output, wherein in a first switch state, the second switch circuit provides a path between the first input and the first output and does not provide a path between the first input and the second output, wherein in the first switch state, the second switch circuit provides a path between the second input and the second output and does not provide a path between the second input and the first output, wherein in a second switch state, the second switch circuit provides a path between the second input and the first output and does not provide a path between the second input and the second output, wherein in the second switch state, the second switch circuit provides a path between the first input and the second output and does not provide a path between the first input and the first output;
a second comparator including a first input coupled to the first output of the second switch circuit and a second input coupled the second output of the second switch circuit.

5. The temperature sensor of claim 1, wherein:
the comparator includes a first output and a second output, wherein the second output is a complementary output to the first output;
the pulse generation circuitry includes a second switch circuit, the second switch circuit including a first input coupled to the first output of the comparator and a second input coupled to the second output of the comparator, the second switch circuit including a first output, wherein in a first switch state, the second switch circuit provides a path between the first input and the first output and does not provide a path between the second input and the first output, wherein in a second switch state, the first switch circuit provides a path between the second input and the first output and does not provide a path between the first input and the first output.

6. The temperature sensor of claim 5 wherein during a first phase of a temperature measurement operation, the second switch is in a first switch state and during a second phase of a temperature measurement operation, the second switch is in a second switch state.

7. The temperature sensor of claim 1 wherein during a temperature measurement operation, the switch circuit switches from the first switch state to the second switch state based on a count by a counter of the counter circuitry of pulses generated by the output of the pulse generation circuitry.

8. The temperature sensor of claim 7 wherein the counter circuitry pauses the counter when the switch circuit switches between the first switch state and the second switch state during a temperature measurement operation.

9. The temperature sensor circuit of claim 1 wherein during a calibration operation, the comparison voltage is an indication of a calibration voltage and the output of the counter circuit provides digital indication of the calibration voltage.

10. A temperature sensor comprising:
ramp generation circuitry including a ramp generator, the ramp generator including a first ramp output to provide a ramp signal and a second ramp output to provide a second ramp signal;
pulse generation circuitry including:
a first switch circuit including a first input coupled to the first ramp output, a second input coupled to receive a comparison voltage, a first output, and a second output, wherein in a first switch state, the first switch circuit provides a path between the first input and the first output and does not provide a path between the first input and the second output, wherein in the first switch state, the first switch circuit provides a path between the second input and the second output and does not provide a path between the second input and the first output, wherein in a second switch state, the first switch circuit provides a path between the second input and the first output and does not provide a path between the second input and the second output, wherein in the second switch state, the first switch circuit provides a path between the first input and the second output and does not provide a path between the first input and the first output;
a comparator including a first input coupled to the first output of the first switch circuit and a second input coupled the second output of the first switch circuit;
a second switch circuit including a first input coupled to the second ramp output, a second input coupled to receive the comparison voltage, a first output, and a second output, wherein in a first switch state, the second switch circuit provides a path between the first input and the first output and does not provide a path between the first input and the second output, wherein in the first switch state, the second switch circuit provides a path between the second input and the second output and does not provide a path between the second input and the first output, wherein in a second switch state, the second switch circuit provides a path between the second input and the first output and does not provide a path between the second input and the second output, wherein in the second switch state, the second switch circuit provides a path between the first input and the second output and does not provide a path between the first input and the first output;
a second comparator including a first input coupled to the first output of the second switch circuit and a second input coupled the second output of the second switch circuit;
an output, wherein during a temperature measurement operation, the comparison voltage is indicative of a measured temperature and the output of the pulse generation circuitry provides a pulse signal that is indicative of the measured temperature;
wherein during a first phase of a temperature measurement operation, the first switch circuit and the second switch circuit are each in the first switch state and during a second phase of a temperature measurement operation, the first switch circuit and the second switch circuit are each in the second switch state;
counter circuitry including an input coupled to the output of the pulse generation circuitry and including an output to provide a digital indication of the measured temperature during a temperature measuring operation, wherein the digital indication is based on pulses provided by the first comparator and the second comparator during the first phase and during the second phase of a temperature measurement operation.

* * * * *